United States Patent
Borlee

(10) Patent No.: US 9,632,145 B2
(45) Date of Patent: Apr. 25, 2017

(54) EQUIPMENT FOR LOGGING AND TRANSMITTING MEASURED VALUES OF PHYSICAL QUANTITIES, AND MEASUREMENT SENSOR FOR SUCH EQUIPMENT

(75) Inventor: Jean-Paul Borlee, Bures sur Yvette (FR)

(73) Assignee: SUEZ ENVIRONNEMENT (FR)

( * ) Notice: Subject to any disclaimer, the term of this patent is extended or adjusted under 35 U.S.C. 154(b) by 1136 days.

(21) Appl. No.: 12/936,029

(22) PCT Filed: Mar. 27, 2009

(86) PCT No.: PCT/FR2009/000344
§ 371 (c)(1),
(2), (4) Date: Nov. 3, 2010

(87) PCT Pub. No.: WO2009/125095
PCT Pub. Date: Oct. 15, 2009

(65) Prior Publication Data
US 2011/0037615 A1    Feb. 17, 2011

(30) Foreign Application Priority Data
Apr. 2, 2008  (FR) ..................... 08 01823

(51) Int. Cl.
    *G01R 31/36*    (2006.01)
(52) U.S. Cl.
    CPC ..... *G01R 31/3675* (2013.01); *G01R 31/3693* (2013.01)

(58) Field of Classification Search
    CPC ............ G01R 31/3675; G01R 31/3679; G01R 31/3682
    (Continued)

(56) References Cited

U.S. PATENT DOCUMENTS 6,532,425 B1 *  3/2003  Boost ................. G01R 31/3624
                                                      320/134
7,061,246 B2 *  6/2006  Dougherty et al. .......... 324/426
(Continued)

FOREIGN PATENT DOCUMENTS

JP     2005-172553 A    6/2005

OTHER PUBLICATIONS

English language translation of the Written Opinion of the International Searching Authority issued in related International Application No. PCT/FR2009/000344.

*Primary Examiner* — Albert Wong
(74) *Attorney, Agent, or Firm* — The Belles Group, P.C.

(57) ABSTRACT

Logging and transmission equipment comprising at least one autonomous measurement sensor, supplied by an electric cell, comprising an emitter able to transmit at various instants at least one value measured by the sensor, and a receiver for gathering the values transmitted by the emitter; the sensor comprises a means of measuring the temperature in the vicinity of the cell; a link is provided for supplying the emitter with the temperature values measured, which emitter is provided so as to transmit, in addition the values of at least one physical quantity, these temperature values measured, at determined intervals, and the receiver is provided so as to store the temperature values measured, estimates the lifetime of the cell by taking account of these measured values, and determine a date for replacing this cell.

7 Claims, 1 Drawing Sheet

(58) Field of Classification Search
USPC ..... 340/870.02–870.03; 702/60–63; 320/150
See application file for complete search history.

(56) References Cited

U.S. PATENT DOCUMENTS

| | | | |
|---|---|---|---|
| 7,498,953 B2* | 3/2009 | Salser et al. | 340/870.02 |
| 7,521,935 B2* | 4/2009 | Uchida | 324/426 |
| 7,541,941 B2* | 6/2009 | Bogolea et al. | 340/870.02 |
| 7,576,545 B2* | 8/2009 | Singh et al. | 324/427 |
| 7,583,202 B2* | 9/2009 | Robinson et al. | 340/870.02 |
| 7,710,073 B2* | 5/2010 | Yamauchi et al. | 320/128 |
| 7,880,641 B2* | 2/2011 | Parris et al. | 340/870.02 |
| 8,046,180 B2* | 10/2011 | Huseth et al. | 702/60 |
| 2007/0029974 A1* | 2/2007 | Uchida | 320/132 |
| 2009/0018785 A1* | 1/2009 | Huseth et al. | 702/63 |
| 2013/0245973 A1* | 9/2013 | Ross et al. | 702/63 |

* cited by examiner

EQUIPMENT FOR LOGGING AND TRANSMITTING MEASURED VALUES OF PHYSICAL QUANTITIES, AND MEASUREMENT SENSOR FOR SUCH EQUIPMENT

CROSS-REFERENCE TO RELATED APPLICATIONS

This application is a 35 U.S.C. 371 National Stage Application of International Application Serial No. PCT/FR09/00344, filed Mar. 27, 2009, claiming priority from French Application No. 0801823, filed Apr. 2, 2008, the entire contents of each are incorporated herein by reference in their entireties.

The invention relates to an item of equipment for logging and transmitting measured values of physical magnitudes, such as those which comprise:
- at least one standalone measurement sensor, powered by an electric cell, comprising a transmitter capable of transmitting at various times at least one value measured by the sensor,
- and a receiver for collecting the values transmitted by the transmitter.

The invention relates more particularly, but not exclusively, to such an item of equipment for the remote logging of fluid meters, notably of water meters, as explained in patent application FR no. 2 904 688, filed on Aug. 4, 2006 under no. 06 07161 and published on Feb. 8, 2008.

The invention applies in particular to measurement sensors communicating to a receiver, forming a central, site, by any appropriate transmission means, in particular by radiofrequency or wire device.

In order to keep such an item of equipment for logging and transmitting measured values in working order, it is appropriate to ensure good maintenance of the measurement sensor, essentially by replacing the sensor before its powering electric cell fails.

Currently, the cells used for this type of application, notably lithium cells, can have lives of 15 years and more for powering electronic circuits, but this period varies greatly, notably depending on the temperatures sustained throughout the life of the sensor. To reduce the risks of the measurement sensor failing due to the draining of the cell, the cell manufacturers usually tend to underestimate the life and to overdimension the cells for a given application. The operators usually tend to replace the sensors with their cells prematurely as a preventive measure.

The result of this is relatively high operating costs.

The object of the invention is mainly to improve the conditions of operation and maintenance of an item of equipment for logging and transmitting measured values of physical magnitudes.

According to the invention, an item of logging and transmission equipment of the type defined above is characterized in that:
- the sensor comprises a means for measuring the temperature in the vicinity of the cell,
- a link is provided to supply to the transmitter the measured temperature values, which transmitter is designed to transmit, in addition to the values of at least one physical magnitude, these measured temperature values, at determined intervals,
- and the receiver is designed to store the measured temperature values, estimate the life of the cell by taking account of these measured values, and determine a date of replacement of this cell.

Advantageously, the receiver is designed to establish a temperature profile of the cell as a function of time, and comprises a means for comparing the temperature profile that has been logged with typical profiles in order to estimate the probable life of the cell.

Preferably, the receiver comprises an electronic circuit capable of initiating an alarm when the measured temperature values exceed a determined threshold.

In particular, if the measurement sensor is fitted to a water meter, the receiver comprises a low temperature threshold for triggering the alarm below 0° C., in order to warn of a risk of freezing.

The receiver may also comprise a high temperature threshold for triggering an alarm, notably of the order of 60° C., corresponding to the maximum temperature that the cell or the sensor itself, or an element of the latter can withstand.

An item of equipment as defined above is advantageously installed in a network for the delivery of fluid, in particular of water, with sensors installed on the fluid meters, the transmitters of the sensors making it possible to ensure a remote logging of consumption.

The invention also relates to a standalone measurement sensor, powered by an electric cell, for an item of equipment for logging and transmitting measured values of physical magnitudes, comprising a transmitter capable of transmitting at different times at least one measured value supplied by the sensor, and characterized in that it comprises a means for measuring the temperature in the vicinity of the cell, and a link provided to supply to the transmitter the measured temperature values, which transmitter is designed to transmit, in addition to the values of at least one physical magnitude, these measured temperature values, at determined intervals.

Apart from the arrangements set cut above, the invention consists of a certain number of other arrangements which will be more explicitly dealt with below with reference to an exemplary embodiment which is described with reference to the appended drawing, but which is in no way limiting. In this drawing.

Figure 1:
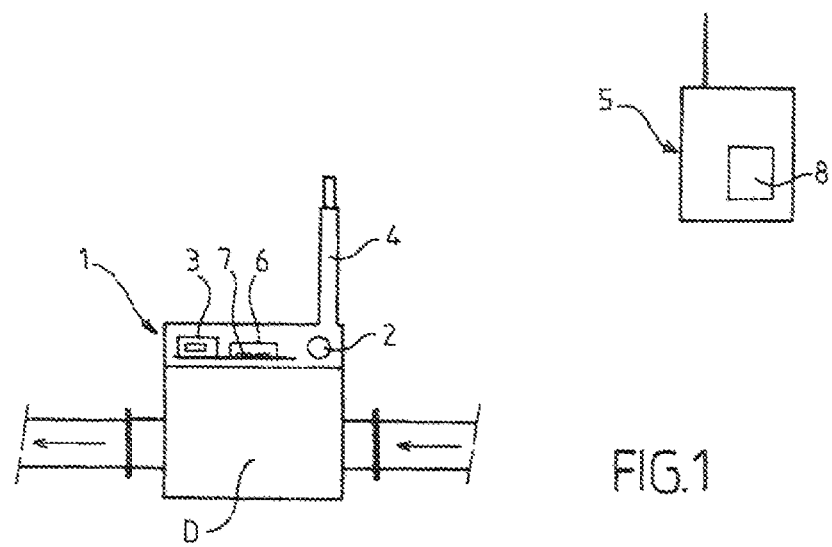
FIG. 1 is a simplified diagram of an item of equipment for logging and transmitting measured values of physical magnitudes, in the case of a water meter.
Figure 2:
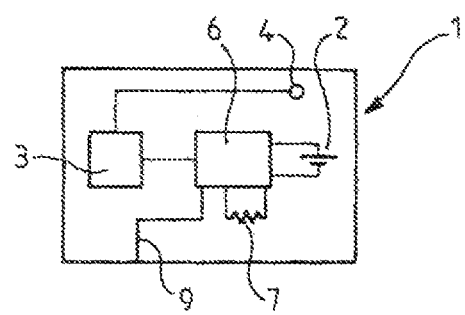
FIG. 2 is a simplified diagram of the electronic circuit with means for measuring temperature and with transmitter.

With reference to FIG. 1 of the drawing, it is possible to see, schematically represented, an item of equipment or installation, for logging and transmitting measured values of physical magnitudes. This item of equipment comprises at least one standalone measurement sensor 1, powered by an electric cell 2, comprising a transmitter 3 with an antenna 4, capable of transmitting by radiofrequency at various times at least one value measured by the sensor 1. The item of equipment also comprises a receiver 5 for collecting the values transmitted by the transmitter 3. As a variant, the transmitter 3 could be connected via a wire device to the receiver 5 and would not include an antenna.

The measurement sensor 1 may be of the type described in the patent application already cited, FR 2 904 688, and be installed in a water meter D. The measurement sensor 1 comprises a transducer sensitive to the rotation of a metal element and capable of creating digital information corresponding to said rotation. The sensor with its transducer is placed against the water meter D and the digital information corresponding to the consumption is sent to a microprocessor 6 programmed to process this information and communicate it to the transmitter 3.

In the diagram of FIG. 1, only one sensor 1 has been shown. Naturally, several sensors like 1, corresponding to several meters D, can be associated with one and the same receiver 5 constituting a central site.

In general, the invention relates to sensors in the broad sense, and more precisely to the meters of liquids or gases sensitive to the ambient temperature (water meters for example), either because the liquid itself is sensitive to temperature (for example freezing for water), or because the metering device is sensitive thereto because of the technologies employed (cold temperature for liquid crystals or cells, high temperature for cells also or certain plastics).

The electronic circuit comprising the microprocessor 6, provided in a communicating sensor, makes possible the reading and periodic transmission of the physical magnitude(s) in question, notably the volume of fluid delivered in the case of a metering of fluid.

An important advantage of such measurement sensors is that they make it possible to carry out remote loggings of consumption, without it being necessary for a person to travel periodically to read the meter. However, the autonomy of the sensor is ensured only if the power cell 2 is still alive.

To keep the item of equipment in working condition, it is therefore appropriate to effectively maintain the sensors 1 and to replace them before the power cell 2 reaches the end of its life. To prevent an absence of logging of the physical magnitude(s) measured during a period from between the end of life of a cell and the replacement of the sensor, the cell manufacturers tend to overdimension the cells and to underestimate their probable life, while the operators tend to replace the sensors long before the end of the underestimated life of the cell. Therefore, the sensors are changed more frequently than necessary, which causes an excess in operating cost.

The invention proposes to systematically add to the main data supplied by the sensor 1, and directly associated with the primary function of this sensor, an item of secondary information relating to the ambient temperature immediately next to the sensor device in order to more accurately estimate the life of the cell.

Moreover, such an arrangement makes it possible to generate warnings if predefined temperature thresholds are exceeded, such as too low temperatures, causing a risk of freezing for a water meter, or else too high temperatures, causing a risk of damage to the cell or to the plastic for a sensor device for example placed oat in the sun in the south of Europe.

The measurement sensor 1 comprises, according to the invention, a temperature-measurement means 7 placed in the vicinity of the cell 2. This measurement means 7 may consist of a platinum resistor, or of any other known temperature-measurement means appropriate for the envisaged application. The measurement means 7 may be immersed with the cell 2 and the electronic circuits in a maintenance and/or protection coating, notably of plastic.

The measurement means 7 may be connected to terminals of the microprocessor 6. A connection is thus established between the measurement means 7 and the transmitter 3. The latter, driven by the microprocessor 6, is designed to transmit the measured values of temperature at determined intervals, in addition to the values of the physical magnitude(s), notably the volume of fluid delivered, to which the sensor is assigned. Four temperature measurements per day can be taken at regular intervals, in which case the transmissions of measured values of temperature will take place every six hours.

The receiver 5 is designed to store the temperature values, estimate the rife of the cell 2 of the sensor in question, taking account of these measured values, and determine a replacement date for this cell. Accordingly, the receiver 5 comprises a computing unit 8, comprising microprocessor and memory, programmed to carry out the operations for storing the measured values and for estimating the life of the cell.

The microprocessor 6 of the sensor 1 receives, processes and communicates to the transmitter 3 other information than the temperature in the vicinity of the cell, notably the volume consumed in the case of a fluid meter, the pressure of the fluid or other physical magnitude supplied to the microprocessor over one or more connections such as 9.

The systematization of the secondary measurement of temperature may be carried out for a reduced marginal cost because a microprocessor frequently comprises a temperature-measurement means for the purposes of compensating for the slippage of the internal clock. In terms of measurement accuracy, a tolerance of ±1° C. is totally acceptable, which remains compatible with low-cost solutions, without requiring particular calibration.

The memory of the computer unit 8 of the receiver 5 can be loaded with typical temperature profiles for the cell, corresponding to a highly probable life.

Figure 3:
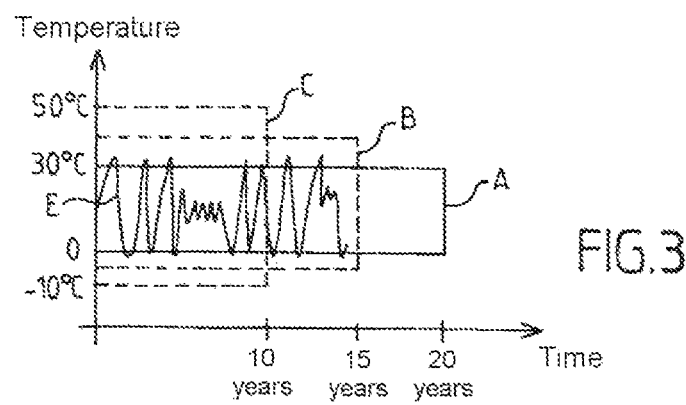
FIG. 3 is a diagram illustrating the possible temperature profiles over time.

FIG. 3 illustrates three possible typical profiles, the temperature being shown on the Y-axis and the time on the X-axis.

The profile A corresponds to a long life: this is the case of a cell exposed to a convenient mean temperature of the order of 15° C., the variations in temperature ranging, for example, between 0° C. and 30° C. The life of the cell is estimated at 20 years.

The standard profile B corresponds to an average life, for example, of 15 years. This is the case of a cell exposed to temperatures ranging, for example, between −2° C. and 40° C.

Profile C corresponds to a short life. This is the case of a cell exposed to more severe temperature conditions, between −10° C. and 50° C., for example for sensors situated in mountainous zones or zones exposed to the sun.

The computing unit 8 stores the measured values of temperature, establishes a real profile E and compares it with the typical profiles illustrated in FIG. 3, and deduces therefrom the probable life for the cell. With the profile E illustrated which stretches beyond the profile A but is situated inside the profile 8, the life would be estimated to be that of profile B, namely 15 years.

To simplify, only three typical profiles have been shown in FIG. 3, whereas it is clearly possible to refine these typical profiles and to take account of the frequency with which the temperature limits of a profile are exceeded by the measured values.

The computing unit 8 is also advantageously designed to trigger an alarm when the measured temperature values exceed a determined threshold.

For example, in the case of a water meter which can be damaged from frost, when the temperature indicated by the sensor 1 is below, for example, −5° C. or −10° C., the computing unit 8 triggers the transmittal of a warning, preferably to the network operator, in order to have the user notified of the risks of freezing of his water meter so that he takes action in order to verify and/or improve the thermal insulation of this meter.

Similarly, in the case of a high temperature, for example higher than +60° C. capable of destroying the cell, a warning is sent by the computing unit 8, usually to the network operator, in order to notify him that the cell is sustaining thermal conditions harmful to its correct operation over time and that it is appropriate to take measures to correct this overheating.

A first example of a concrete application relates to a water company. The invention makes it possible to identify, in a period of great cold, the meters that are subjected to excessively low temperatures making them likely to freeze and therefore to be irremediably damaged, which would cause considerable leakages and costly water damage both for the user and for the water company. On the basis of the temperature information uploaded by the computing unit 8, the water company can put in place preventive actions, for example by warning the users concerned to encourage them to correct the problem by installing insulating devices covering the water meters.

Another example of application would relate to a water company managing a population of sensors which, in summer, can be subjected to excessively high temperatures, having a harmful impact on the life of the cells. On this basis, the water company can either take account of this information in order to correct the hoped-for life of the sensors subjected to these high temperatures and plan an early replacement, or put in place heat protection.

The invention makes it possible to substantially improve the maintenance of standalone measurement sensors. The operating costs of a delivery installation with meters fitted with remote-logging sensors are substantially reduced.

The invention claimed is:

1. An item of equipment for logging and transmitting measured values of physical magnitudes, comprising:
    at least one standalone measurement sensor configured to measure a plurality of the values of physical magnitudes, the sensor being powered by an electric cell and comprising a transmitter configured to transmit at determined intervals at least one of the values measured by the sensor,
    and a receiver for collecting the values transmitted by the transmitter, wherein:
    the sensor comprises a means for measuring a temperature in the vicinity of the cell to obtain a temperature value as one of the values of physical magnitude, wherein the measured temperature relates to the ambient temperature immediately next to the sensor,
    a link is provided to supply to the transmitter the measured temperature value, which transmitter is configured to transmit the at least one of the measured values, which includes the measured temperature value, at the determined intervals,
    and the receiver is configured to:
        receive and store each measured temperature value,
        establish a cell temperature profile as a function of time only from the stored measured temperatures,
        compare the established cell temperature profile with a plurality of predetermined typical temperature profiles, each predetermined typical profile having an upper temperature threshold, a lower temperature threshold, and a time period, the upper temperature thresholds being different from each other, the lower temperature thresholds being different from each other, the time periods being different from each other, and each time period representing one of a plurality of predetermined life spans for typical cells, to identify a first of the predetermined typical temperature profiles, the first of the predetermined typical temperature profiles having the time period which is longest amongst the predetermined typical temperature profiles for which the cell temperature profile remains between the respective upper and lower temperature thresholds, and
        determine a date of replacement of the cell based only on the time period of the first of the predetermined typical temperature profiles.

2. The item of equipment as claimed in claim 1, wherein the receiver comprises an electronic circuit configured to initiate an alarm when the measured temperature values exceed a determined threshold.

3. The item of equipment as claimed in claim 2, with measurement sensor fitted to a water meter, wherein the receiver comprises a low temperature threshold for triggering the alarm below 0° C., in order to warn of a risk of freezing.

4. The item of equipment as claim in claim 1, wherein the receiver comprises a high temperature threshold for triggering an alarm corresponding to the maximum temperature that the cell can withstand.

5. The item of equipment as claimed in claim 4, wherein the high temperature threshold for triggering an alarm is of the order of 60° C.

6. The item of equipment as claimed in claim 1, wherein it is installed in a network for the delivery of fluid, in particular water, with sensors installed on the fluid meters, the transmitters of the sensors making it possible to ensure a remote logging of consumption.

7. An item of equipment installed in a network for the delivery of fluid, for logging and transmitting measured values of fluid meters, comprising:
    at least one standalone measurement sensor located near a first of the fluid meters and configured to measure a plurality of values of physical magnitudes associated with the first fluid meter, the sensor being powered by an electric cell and comprising a transmitter configured to transmit at determined intervals at least one of the values measured by the sensor,
    and a receiver for collecting the values transmitted by the transmitter, wherein:
    the sensor comprises a means for measuring a temperature in the vicinity of the cell to obtain a temperature value as one of the values of physical magnitude, wherein the measured temperature relates to the ambient temperature immediately next to the sensor,
    a link is provided to supply to the transmitter the measured temperature value, which transmitter is configured to transmit the at least one of the measured values, which includes the measured temperature value, at the determined intervals,
    and the receiver is configured to:
        receive and store each measured temperature value,
        establish a cell temperature profile as a function of time only from the stored measured temperatures,
        compare the established cell temperature profile with a plurality of predetermined typical temperature profiles, each predetermined typical profile having an upper temperature threshold, a lower temperature threshold, and a time period, the upper temperature thresholds being different from each other, the lower temperature thresholds being different from each other, the time periods being different from each other, and each time period representing one of a plurality of predetermined life spans for typical cells, to identify a first of the predetermined typical temperature profiles, the first of the predetermined typical temperature profiles having the time period which is longest amongst the predetermined typical temperature profiles for which the cell temperature profile remains between the respective upper and lower temperature thresholds, and determine a date of replacement of the cell based only on the time period of the first of the predetermined typical temperature profiles.

\* \* \* \* \*